(12) United States Patent
Mitta et al.

(10) Patent No.: US 11,658,251 B2
(45) Date of Patent: May 23, 2023

(54) SOLAR CELL, SOLAR CELL MANUFACTURING SYSTEM, AND SOLAR CELL MANUFACTURING METHOD

(71) Applicant: SHIN-ETSU CHEMICAL CO., LTD., Tokyo (JP)

(72) Inventors: Ryo Mitta, Ibaraki (JP); Takenori Watabe, Gunma (JP); Hiroyuki Ohtsuka, Nagano (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/864,886

(22) Filed: Jul. 14, 2022

(65) Prior Publication Data

US 2022/0352396 A1    Nov. 3, 2022

Related U.S. Application Data

(62) Division of application No. 16/308,294, filed as application No. PCT/JP2017/014035 on Apr. 4, 2017, now Pat. No. 11,424,372.

(30) Foreign Application Priority Data

Jun. 10, 2016  (JP) .............................. JP2016-115893

(51) Int. Cl.
*H01L 31/0224*    (2006.01)
*H01B 1/02*    (2006.01)
(Continued)

(52) U.S. Cl.
CPC ..... *H01L 31/022425* (2013.01); *H01B 1/023* (2013.01); *H01B 1/16* (2013.01);
(Continued)

(58) Field of Classification Search
CPC ....... H01L 31/022425; H01L 31/02167; H01L 31/068; H01L 31/1864; H01L 31/1868;
(Continued)

(56) References Cited

U.S. PATENT DOCUMENTS

2002/0139415 A1    10/2002  Shimizu et al.
2007/0095387 A1    5/2007  Fujii et al.
(Continued)

FOREIGN PATENT DOCUMENTS

GB    2137533    10/1984
JP    60-25656    2/1985
(Continued)

OTHER PUBLICATIONS

Yashiki, JP-2011243806-A, Machine Translation (Year: 2011).*
(Continued)

*Primary Examiner* — Devina Pillay
(74) *Attorney, Agent, or Firm* — Greenblum & Bernstein, P.L.C.

(57) ABSTRACT

An object of the present invention is to provide, at a low cost, a system and a method for manufacturing a solar cell having high conversion efficiency. A solar cell according to the present invention is characterized by including a passivation film that protects a semiconductor substrate, a first finger electrode connected to the semiconductor substrate on a main surface of the semiconductor substrate, a first bus bar electrode that intersects the first finger electrode, and an intermediate layer provided in an intersecting position of the first finger electrode and the first bus bar electrode. The solar cell is characterized in that the first finger electrode and the first bus bar electrode are electrically connected to each other via the intermediate layer.

3 Claims, 5 Drawing Sheets

(51) Int. Cl.
*H01B 1/16* (2006.01)
*H01B 1/22* (2006.01)
*H01L 31/0216* (2014.01)
*H01L 31/068* (2012.01)
*H01L 31/18* (2006.01)

(52) U.S. Cl.
CPC ......... *H01B 1/22* (2013.01); *H01L 31/02167* (2013.01); *H01L 31/068* (2013.01); *H01L 31/1864* (2013.01); *H01L 31/1868* (2013.01)

(58) Field of Classification Search
CPC ........... H01L 31/0224; H01L 31/02002; Y02E 10/547; Y02E 10/50
See application file for complete search history.

(56) References Cited

U.S. PATENT DOCUMENTS

| | | |
|---|---|---|
| 2011/0111236 A1 | 5/2011 | Pahl et al. |
| 2012/0180862 A1* | 7/2012 | Hieslmair ........... H01L 31/0201 257/E31.124 |
| 2014/0020742 A1 | 1/2014 | Hasegawa et al. |
| 2014/0020747 A1 | 1/2014 | Kim et al. |
| 2014/0332072 A1 | 11/2014 | Beaucarne et al. |
| 2014/0360567 A1 | 12/2014 | Seutter et al. |
| 2015/0171247 A1 | 6/2015 | Maruko et al. |
| 2015/0318414 A1 | 11/2015 | Han et al. |
| 2016/0005905 A1 | 1/2016 | Jang et al. |
| 2017/0077320 A1* | 3/2017 | Sun ................. H01L 31/022425 |

FOREIGN PATENT DOCUMENTS

| | | |
|---|---|---|
| JP | 2008-506796 | 3/2008 |
| JP | 2011-243806 | 12/2011 |
| JP | 2011243806 A * | 12/2011 |
| JP | 2012-526399 | 10/2012 |
| JP | 2012-212769 | 11/2012 |
| WO | 2010/129884 | 11/2010 |
| WO | 2012/081813 A1 | 6/2012 |

OTHER PUBLICATIONS

Official Communication issued in International Application No. PCT/JP2017/014035, dated Jun. 27, 2017, together with an English translation thereof.

Supplementary European Search Report dated Mar. 25, 2020 issued for EPO Application No. 17809942.0.

* cited by examiner

SOLAR CELL, SOLAR CELL MANUFACTURING SYSTEM, AND SOLAR CELL MANUFACTURING METHOD

CROSS REFERENCE TO RELATED APPLICATIONS

The present application is a divisional application of U.S. patent application Ser. No. 16/308,294, filed on Dec. 7, 2018, which a National Phase application of International Application No. PCT/JP2017/014035, filed on Apr. 4, 2017, and claims the benefit of Japanese Patent Application No. 2016-115893, filed on Jun. 10, 2016. The entire disclosure of each of the above-identified applications, including the specification, drawings, and claims, is incorporated herein by reference in its entirety.

TECHNICAL FIELD

The present invention relates to a solar cell, a solar cell manufacturing system, and a solar cell manufacturing method.

BACKGROUND ART

In recent years, a so-called PR (Passivated Rear) structure-type solar cell has been proposed as a highly efficient solar cell. Characteristics of the PR structure-type solar cell are that the rear surface of a substrate is covered with a protective film that has a high passivation effect and in which an optical loss less easily occurs and a contact part of the substrate and a back electrode is localized to reduce surface recombination of carriers. This back electrode includes bus bar electrodes for extracting a photo-generated current generated in the solar cell to the outside and finger electrodes that are connected to these bus bar electrodes and in contact with the substrate. Note that, in the following explanation, a surface of the substrate on a light receiving surface side of a solar cell is referred to as a light receiving surface and a surface of the substrate on the opposite side of the light receiving surface is referred to as a rear surface.

In general, the finger electrodes and the bus bar electrodes functioning as the back electrode are formed by printing conductive silver paste containing glass frit or the like and thereafter drying and baking the conductive silver paste to penetrate a passivation film. However, the conductive silver paste is expensive because silver is a main component. Use of the conductive silver paste leads to an increase in the manufacturing cost of the solar cell. When the conductive silver paste is used, there is a problem in that surface recombination rate in contact sections of the electrodes and the substrate increases. There is also a problem in that contact resistance between the substrate, on which a diffusion layer is not formed or surface concentration of the diffusion layer is low, and the electrodes is extremely high. Therefore, there is a demand for an electrode that is inexpensive, has low contact resistance, and can reduce surface recombination rate.

In order to solve the problems, it is desirable to use, as a method of forming the finger electrodes, a method of printing conductive aluminum paste and thereafter drying and baking the conductive aluminum paste to penetrate the passivation film. The conductive aluminum paste has an extremely low unit price per gram. Manufacturing cost can be reduced. During the baking of the conductive aluminum paste, a $p^+$ layer is formed in a contact section of the substrate and the conductive aluminum paste. Therefore, there is an advantage that, compared with when the conductive silver paste is used, an increase in the surface recombination rate in the contact sections of the electrodes and the substrate can be suppressed and the contact resistance between the substrate, on which a diffusion layer is not formed or surface concentration of the diffusion layer is low, and the electrodes can be reduced.

Further, in order to solve the problems, as a method of forming the bus bar electrode, it is desirable to use a method of printing low-temperature thermosetting silver paste and thereafter drying and heating the low-temperature thermosetting silver paste to connect the low-temperature thermosetting silver paste to only the finger electrodes. An electrode formed using the low-temperature thermosetting silver paste does not penetrate the passivation film. Therefore, a photo-generated current collected from connecting sections to the finger electrodes can be efficiently extracted to the outside without increasing the surface recombination rate of the substrate.

From the demand explained above, in the PR structure-type solar battery cell, it is desirable to form the finger electrodes by baking the conductive aluminum paste and form the bus bar electrodes by heating the low-temperature thermosetting silver paste. However, aluminum oxide films having high resistance are formed on the electrode surfaces of the finger electrodes formed by baking the conductive aluminum paste. Therefore, there is a problem in that contact resistance between the finger electrodes and the bus bar electrodes formed using the low-temperature thermosetting silver paste is high.

As measures against such a problem, there is a method of removing the aluminum oxide films with ultrasonic cleaning and photochemical etching of the aluminum oxide films (e.g., Patent Literature 1). However, in this case, a new problem occurs in that complicated etching processes increase, leading to a cost increase, heavy metal contamination on the substrate occurs during cleaning and a life time decreases, and a yield decreases.

There is a method of performing processing for cleaning and activating the surfaces of the aluminum oxide films of the finger electrodes and partially covering the surfaces with an adhesion promoter to enable the finger electrodes to be bonded with the bus bar electrodes (e.g., Patent Literature 2). However, in this case as well, a problem occurs in that a cost increase due to cleaning work of the surfaces and a yield decrease easily occur.

Besides, there is also a method of removing the aluminum oxide films with sandblast by aluminum beads (e.g., Patent Literature 3). However, there is a problem in that the substrate surface is damaged to increase the surface recombination rate and reduce a yield.

CITATION LIST

Patent Literature

Patent Literature 1: National Publication of International Patent Application No. 2012-526399

Patent Literature 2: National Publication of International Patent Application No. 2008-506796

Patent Literature 3: Japanese Patent Laid-Open No. 60-25656

SUMMARY OF INVENTION

Technical Problem

Therefore, the present invention has been devised in order to solve the problems described above, and an object of the present invention is to connect, with a simple method, at low resistance, finger electrodes that are inexpensive and have low contact resistance and low surface recombination rate of an interface and bus bar electrodes having low surface recombination rate of an interface and provide, with a stable yield and inexpensively, a solar cell having high conversion efficiency.

Solution to Problem

In view of the problems described above, the inventors have devised the present invention as a result of earnestly repeating studies. That is, a solar cell of the present invention is a solar cell in which an intermediate layer formed by baking conductive silver paste is provided between an aluminum finger electrode formed by baking conductive aluminum paste and a bus bar electrode formed by heating a low-temperature thermosetting silver paste.

For example, the conductive silver paste is used for this intermediate layer. Consequently, when an aluminum electrode is used as a finger electrode, glass in the conductive silver paste breaks an aluminum oxide film of the aluminum electrode to form a silver-aluminum alloy. Consequently, contact resistance between the intermediate layer and the aluminum electrode (the finger electrode) can be reduced.

Contact resistance between the electrode (the intermediate layer) formed by the conductive silver paste and the bus bar electrode formed by the low-temperature thermosetting silver paste can be reduced because a main component of both of the electrodes is silver. Therefore, the finger electrode formed by baking the conductive aluminum paste and the bus bar electrode formed by heating the low-temperature thermosetting silver paste are electrically connected at low resistance via this intermediate layer. An inexpensive and highly efficient solar cell that achieves both of the aluminum electrode (the finger electrode) and the low-temperature thermosetting bus bar electrode is manufactured.

An amount of the paste forming this intermediate layer is extremely small compared with amounts of use of the paste forming the finger electrode and the paste forming the bus bar electrode. Even if the amount of the paste is small, sufficiently low resistance between the finger electrode and the bus bar electrode is realized. Therefore, even if the silver paste is used, the use of the silver paste hardly affects a cost increase.

The solar cell according to the present invention can be applied to not only the PR structure-type solar cell but also, for example, a back contact type solar cell to improve conversion efficiency. As an electrode connected to a $p^+$ layer of the back contact type solar cell, a finger electrode formed by baking conductive aluminum paste and a bus bar electrode formed by heating low-temperature thermosetting silver paste are considered to be desirable.

As an electrode connected to an $n^+$ layer, a finger electrode formed by baking conductive silver paste for a general finger electrode and the bus bar electrode formed by heating the low-temperature thermosetting silver paste are considered to be desirable. This is because, when aluminum paste is used for the electrode connected to the $n^+$ layer, the $p^+$ layer is formed in the n+ layer, leading to conversion efficiency deterioration.

In view of these demands, when the present invention is applied to the back contact type solar cell, for example, a method of printing and drying the conductive aluminum paste on the $p^+$ layer and thereafter printing and drying the conductive silver paste in a part formed as an intermediate layer on the $n^+$ layer and on the $p^+$ layer and thereafter baking the conductive silver paste is adopted. Consequently, the aluminum finger electrode connected to the $p^+$ layer, the silver finger electrode connected to the $n^+$ layer, and the intermediate layer on the aluminum finger electrode can be formed.

Thereafter, the bus bar electrode formed using the low-temperature thermosetting silver paste is formed. In this case, the silver finger electrode connected to the n+ layer and the intermediate layer on the aluminum finger electrode can be simultaneously formed by, for example, screen printing. Therefore, there is an advantage that the number of processes does not increase compared with a process in which the intermediate layer is not formed and influence on cost is extremely small.

Therefore, a solar cell according to the present invention is characterized by including: a passivation film that protects a semiconductor substrate; a first finger electrode connected to the semiconductor substrate on a main surface of the semiconductor substrate; a first bus bar electrode that intersects the first finger electrode; and an intermediate layer provided in an intersecting position of the first finger electrode and the first bus bar electrode. The solar cell is characterized in that the first finger electrode and the first bus bar electrode are electrically connected to each other via the intermediate layer.

The solar cell according to the present invention is characterized in that the first finger electrode includes a sintered body of aluminum, the first bus bar electrode includes a sintered body of epoxy resin or acrylic resin and silver, and the intermediate layer includes a sintered body of glass frit and silver.

A solar cell according to the present invention is characterized by including: a first impurity diffusion layer of a first conductivity type provided on a main surface of a semiconductor substrate; a second impurity diffusion layer of a second conductivity type provided on the main surface; a passivation film that protects the semiconductor substrate, the first diffusion layer, and the second diffusion layer; a first finger electrode connected to the first diffusion layer on the main surface; a second finger electrode connected to the second diffusion layer on the main surface; a first bus bar electrode that intersects the first finger electrode; a second bus bar electrode that intersects the second finger electrode; and an intermediate layer provided in an intersecting position of the first finger electrode and the first bus bar electrode. The solar cell is characterized in that the first finger electrode and the first bus bar electrode are electrically connected to each other via the intermediate layer.

The solar cell according to the present invention is characterized in that the first finger electrode includes a sintered body of aluminum, the first bus bar electrode includes a sintered body of epoxy resin or acrylic resin and silver, and the second finger electrode and the intermediate layer include a sintered body of glass frit and silver.

The solar cell according to the present invention is characterized in that, when an area of the intermediate layer when viewed in a direction orthogonal to the main surface in the intersecting position of the first finger electrode and the first bus bar electrode is represented as A and an intersecting area of the first finger electrode and the first bus bar electrode is represented as B, A/B is 0.01 or more and 1 or less.

A manufacturing system for a PR (Passivated Rear) structure-type solar cell according to the present invention at least including: a film forming apparatus that forms a passivation film that protects a semiconductor substrate; a finger-electrode forming apparatus that forms a first finger electrode connected to the semiconductor substrate on a main surface of the semiconductor substrate; an intermediate-layer forming apparatus that forms an intermediate layer on the first finger electrode; and a bus-bar-electrode forming apparatus that forms a first bus bar electrode that intersects the first finger electrode via the intermediate layer. The finger-electrode forming apparatus bakes conductive aluminum paste to form the first finger electrode, the intermediate-layer forming apparatus bakes first conductive silver paste containing glass frit to form the intermediate layer. The conductive aluminum paste and the first conductive silver paste are simultaneously baked. The manufacturing system is characterized in that the bus-bar-electrode forming apparatus heats second conductive silver paste containing epoxy resin or acrylic resin to form the first bus bar electrode, and a difference between a baking time peak temperature of the conductive aluminum paste and the first conductive silver paste and a heating time peak temperature of the second conductive silver paste is 300° C. or more and 700° C. or less.

A manufacturing system for a back contact type solar cell according to the present invention at least includes: a diffusion-layer forming apparatus that forms a first diffusion layer of a first conductivity type provided on a main surface of a semiconductor substrate and a second diffusion layer of a second conductivity type provided on the main surface; a film forming apparatus that forms a passivation film that protects the semiconductor substrate, the first diffusion layer, and the second diffusion layer; a first-finger-electrode forming apparatus that forms a first finger electrode connected to the first diffusion layer on the main surface; a second-finger-electrode forming apparatus that forms a second finger electrode connected to the second diffusion layer on the main surface; an intermediate-layer forming apparatus that forms an intermediate layer on the first finger electrode; a first-bus-bar-electrode forming apparatus that forms a first bus bar electrode that intersects the first finger electrode via the intermediate layer; and a second-bus-bar-electrode forming apparatus that forms a second bus bar electrode that intersects the second finger electrode. The second-finger-electrode forming apparatus bakes first conductive silver paste containing glass frit to form the second finger electrode, the intermediate-layer forming apparatus bakes second conductive silver paste containing glass frit to form the intermediate layer, the first-finger-electrode forming apparatus bakes conductive aluminum paste to form the first finger electrode. The first conductive silver paste, the second conductive silver paste, the conductive aluminum paste are simultaneously baked. The manufacturing system is characterized in that the first-bus-bar-electrode forming apparatus heats third conductive silver paste containing epoxy resin or acrylic resin to form the first bus bar electrode, and a difference between a baking time peak temperature of the first conductive silver paste, the second conductive silver paste, and the conductive aluminum paste and a heating time peak temperature of the third conductive silver paste is 300° C. or more and 700° C. or less.

A solar cell manufacturing method according to the present invention is characterized by including: a step of forming a passivation film on a semiconductor substrate; a step of forming a first finger electrode connected to the semiconductor substrate on a main surface of the semiconductor substrate; a step of forming an intermediate layer on the first finger electrode; and a step of forming a first bus bar electrode that intersects the first finger electrode via the intermediate layer. The solar cell manufacturing method is characterized in that, in the step of forming the first finger electrode, conductive aluminum paste is baked to form the first finger electrode, in the step of forming the intermediate layer, first conductive silver paste containing glass frit is baked to form the intermediate layer, the conductive aluminum paste and the first conductive silver paste are simultaneously baked, in the step of forming the first bus bar electrode, second conductive silver paste containing epoxy resin or acrylic resin is heated to form the first bus bar electrode, and a difference between a baking time peak temperature of the conductive aluminum paste and the first conductive silver paste and a heating time peak temperature of the second conductive silver paste is 300° C. or more and 700° C. or less A solar cell manufacturing method according to the present invention is characterized by including: a step of forming a first diffusion layer of a first conductivity type provided on a main surface of a semiconductor substrate and a second diffusion layer of a second conductivity type provided on the main surface; a step of forming a passivation film that protects the semiconductor substrate, the first diffusion layer, and the second diffusion layer; a step of forming a first finger electrode connected to the first diffusion layer on the main surface; a step of forming a second finger electrode connected to the second diffusion layer on the main surface; a step of forming an intermediate layer on the first finger electrode; a step of forming a first bus bar electrode that intersects the first finger electrode via the intermediate layer; and a step of forming a second bus bar electrode that intersects the second finger electrode. The solar cell manufacturing method is characterized in that, in the step of forming the second finger electrode, first conductive silver paste containing glass frit is baked to form the second finger electrode, in the step of forming the intermediate layer, second conductive silver paste containing glass frit is baked to form the intermediate layer, in the step of forming the first finger electrode, conductive aluminum paste is baked to form the first finger electrode, the first conductive silver paste, the second conductive silver paste, and the conductive aluminum paste are simultaneously baked, in the step of forming the first bus bar electrode, third conductive silver paste containing epoxy resin or acrylic resin is heated to form the first bus bar electrode, and a difference between a baking time peak temperature of the first conductive silver paste, the second conductive silver paste, and the conductive aluminum paste and a heating time peak temperature of the third conductive silver paste is 300° C. or more and 700° C. or less.

The solar cell manufacturing method according to the present invention is characterized in that application of the first conductive silver paste forming the second finger electrode and application of the second conductive silver paste forming the intermediate layer are simultaneously performed.

DESCRIPTION OF EMBODIMENTS

An embodiment of the present invention is explained in detail below. Note that the present invention can be carried out in a wide range of other embodiments in addition to the following explanation. The scope of the present invention is not limited to the following explanation and is described in the scope of claims. Further, the drawings are not shown in proportion to actual sizes. To further clarify the explanation and the understanding of the present invention, dimensions are enlarged depending on related members. Unimportant portions are not illustrated.

(General PR Structure-Type Solar Battery Cell)

Figure 1:
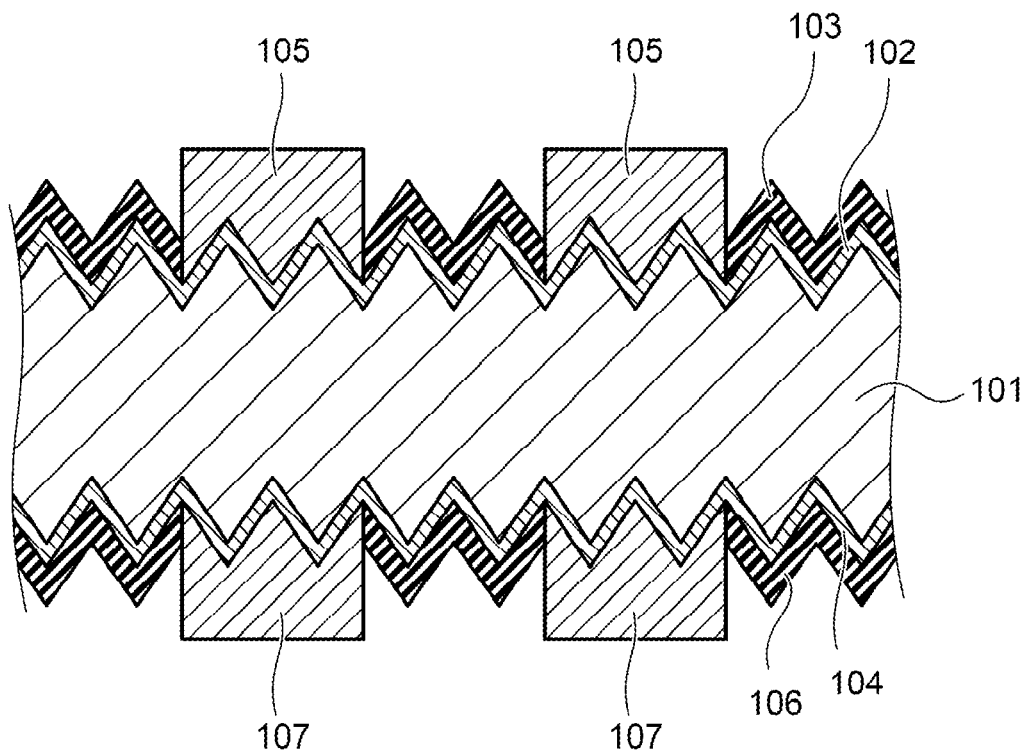
FIG. 1 is a schematic sectional view illustrating a PR structure-type solar cell.

First, a manufacturing process for a general PR structure-type solar cell is explained with reference to FIG. 1, which is a schematic sectional view of the PR structure-type solar cell. First, a semiconductor substrate 101 is prepared. A single crystal or polycrystal silicon or the like is used for the semiconductor substrate 101. A conductivity type of the semiconductor substrate 101 may be either a p type or an n type. However, a p-type silicon substrate including a p-type semiconductor impurity such as boron and having specific resistance of 0.1 to 4.0 Ω·cm is often used. In the following explanation, a solar cell manufacturing method using the p-type silicon substrate is explained as an example. As the semiconductor substrate 101, a tabular semiconductor substrate having size of 100 to 150 mm square and thickness of 0.05 to 0.30 mm is suitably used.

Subsequently, the semiconductor substrate 101 is immersed in, for example, an acid solution to remove damage to the surface of the semiconductor substrate 101 due to slicing or the like and then further chemically etched by an alkali solution such as a potassium hydroxide solution and cleaned and dried to form uneven structure called texture on both the surfaces of the substrate. The uneven structure causes multiple reflection of light on a solar cell light receiving surface. Therefore, by forming the uneven structure, reflectance effectively decreases and conversion efficiency is improved.

Subsequently, a BSF (Back Surface Field) layer 104 is formed. The semiconductor substrate 101 is set in a high-temperature gas of 800 to 1100° C. including, for example, $BBr_3$. A p-type diffusion layer and a glass layer having sheet resistance of 20 to 300 Ω/square are formed on the rear surface of the semiconductor substrate 101 by a thermal diffusion method for diffusing a p-type impurity element such as boron on the rear surface.

In this case, by diffusing the p-type impurity element in a state in which light receiving surfaces of two semiconductor substrates 101 are opposed and superimposed during thermal diffusion, p-type diffusion layer formation on the light receiving surfaces can be prevented. Thereafter, by immersing the semiconductor substrate 101 in a chemical such as a diluted hydrofluoric acid solution, the glass layer formed on the surface of the semiconductor substrate 101 during the diffusion is removed. The semiconductor substrate 101 is cleaned by pure water.

Subsequently, an emitter layer 102 is formed. The semiconductor substrate 101 is set in a high-temperature gas of 850 to 1100° C. including, for example, $POCl_3$. An n-type diffusion layer and a glass layer having sheet resistance of 30 to 300 Ω/square are formed on the light receiving surface by a thermal diffusion method for diffusing an n-type impurity element such as phosphorus over the entire surface of the semiconductor substrate 101. The n-type diffusion layer becomes the emitter layer 102.

Note that, when the n-type diffusion layer is formed by the thermal diffusion method, the n-type diffusion layer is sometimes formed on the rear surface and the edge face of the semiconductor substrate 101 as well. Even in this case, by diffusing the n-type impurity element in a state in which rear surfaces of two semiconductor substrates 101 are opposed and superimposed during thermal diffusion, n-type diffusion layer formation on the rear surfaces can be prevented. Thereafter, by immersing the semiconductor substrate 101 in a chemical such as a diluted hydrofluoric acid solution, the glass layer formed on the surface of the substrate during the diffusion is removed. The semiconductor substrate 101 is cleaned by pure water. The emitter layer 102 is formed after the BSF layer 104 is formed. However, the BSF layer 104 may be formed after the emitter layer 102 is formed.

Subsequently, passivation films 103 and 106 used as antireflection films as well are respectively formed on the light receiving surface and the rear surface of the semiconductor substrate 101. The passivation films 103 and 106 are made of, for example, SiN (silicon nitride) and are formed by a plasma CVD method or the like for diluting, for example, a mixed gas of $SiH_4$ and $NH_3$ with $N_2$, converting the mixed gas into plasma with glow discharge decomposition, and depositing the plasma. The passivation films 103 and 106 are formed to have a refractive index of approximately 1.8 to 2.3 considering, for example, a refractive index difference between the passivation films 103 and 106 and the semiconductor substrate 101. The passivation films 103 and 106 are formed at thickness of approximately 500 to 1000 Å (angstrom).

The passivation films 103 and 106 are provided to prevent light from reflecting on the surface of the semiconductor substrate 101 and effectively capturing the light into the semiconductor substrate 101. This SiN also functions as a passivation film having a passivation effect for the n-type diffusion layer in the formation and has an effect of improving an electric characteristic of the solar cell together with an antireflection function. This film is not limited to the silicon nitride. A single layer film of silicon oxide, silicon carbide, amorphous silicon, aluminum oxide, or titanium oxide or a laminated film obtained by combining silicon oxide, silicon carbide, amorphous silicon, aluminum oxide, and titanium oxide may be used. Different films may be used for the light receiving surface and the rear surface.

Subsequently, conductive silver paste containing, for example, silver powder and glass frit is screen-printed on the light receiving surface and the rear surface of the semiconductor substrate 101 and is dried. Thereafter, the conductive paste on the light receiving surface and the rear surface is baked at temperature of approximately 500° C. to 950° C. for approximately 1 to 60 seconds to penetrate the passivation films 103 and 106, and an electrode formed by sintering the silver powder and the silicon are conducted to form electrodes 105 and 107. Note that the order of the electrode formation on the light receiving surface and the rear surface may be changed or the baking on the light receiving surface and the rear surface may be performed at a time.

In the manufacturing method for the general PR structure-type solar cell explained above, the finger electrode and the bus bar electrode on the rear surface are formed by baking the conductive silver paste containing the silver powder, the glass frit, or the like. However, when the method explained above is used, an amount of use of the expensive conductive silver paste increases and adversely affects manufacturing cost. Moreover, there is a problem in that recombination rate between the electrodes 105 and 107 and the semiconductor substrate 101 greatly increases to prevent a conversion efficiency increase.

These problems are solved by the present invention. Specifically, the finger electrode is formed by baking inexpensive conductive aluminum paste and the bus bar electrode is formed by heating low-temperature thermosetting silver paste. In this case, an intermediate layer formed by baking conductive silver paste is formed between the finger electrode and the bus bar electrode. Consequently, it is possible to electrically connect the finger electrode and the bus bar electrode while reducing carrier recombination of the bus bar electrode and a silicon substrate interface while reducing contact resistance and carrier recombination rate of the finger electrode and the silicon substrate interface. Therefore, it is possible to increase conversion efficiency while reducing manufacturing cost.

(PR Structure-Type Solar Cell)

Figure 2:
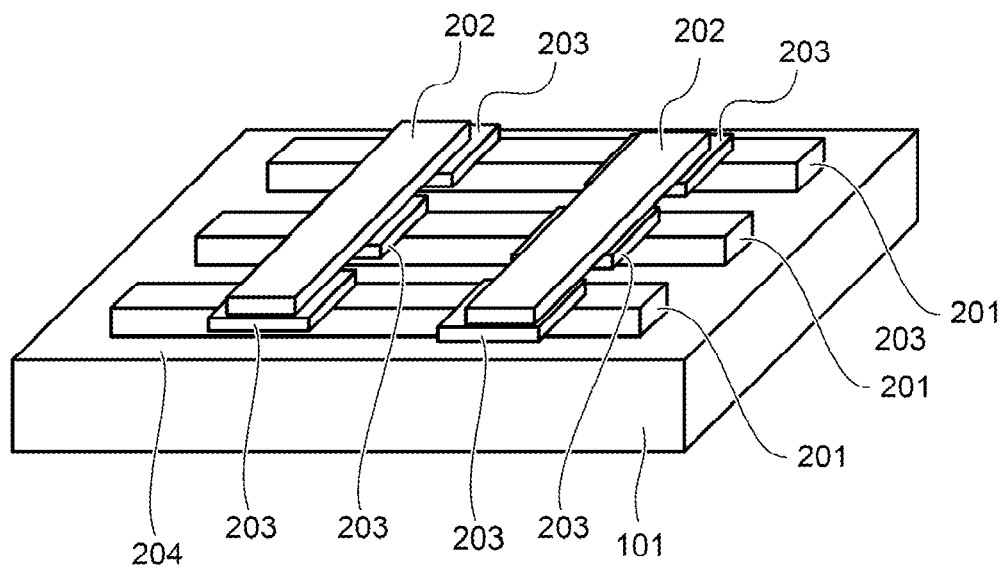
FIG. 2 is a perspective view of the rear surface of the PR structure-type solar cell.

FIG. 2 is a perspective view of the rear surface of a PR structure-type solar battery cell applied with the solar battery according to the present invention. The PR structure-type solar battery cell according to this embodiment is different from the general PR structure-type solar cell explained above in the structure of an electrode. The semiconductor substrate 101, the texture structure provided on the semiconductor substrate 101, the BSF layer 104, and the passivation films 103 and 106 are the same.

A rear surface finger electrode 201 and a rear surface bus bar electrode 202 are provided on the rear surface of the semiconductor substrate 101. A plurality of rear surface finger electrodes 201 are provided in parallel at predetermined intervals and connected to the semiconductor substrate 101. The rear surface bus bar electrode 202 is provided to intersect the plurality of rear surface finger electrodes 201.

An intermediate layer 203 is provided between the rear surface finger electrode 201 and the rear surface bus bar electrode 202. In FIG. 2, for convenience of explanation, the intermediate layer 203 is drawn large. The intermediate layer 203 is provided in an intersecting position of the rear surface finger electrode 201 and the rear surface bus bar electrode 202. The rear surface finger electrode 201 and the rear surface bus bar electrode 202 are electrically connected to each other via the intermediate layer 203. That is, carriers generated from the solar cell are efficiently extracted to the rear surface bus bar electrode 202 via the intermediate layer 203 passing through the rear surface finger electrode 201.

(Manufacturing System for the PR Structure-Type Solar Cell)

Subsequently, a solar cell manufacturing system 400 suitable for manufacturing of the PR structure-type solar cell explained above is explained.

Figure 3:
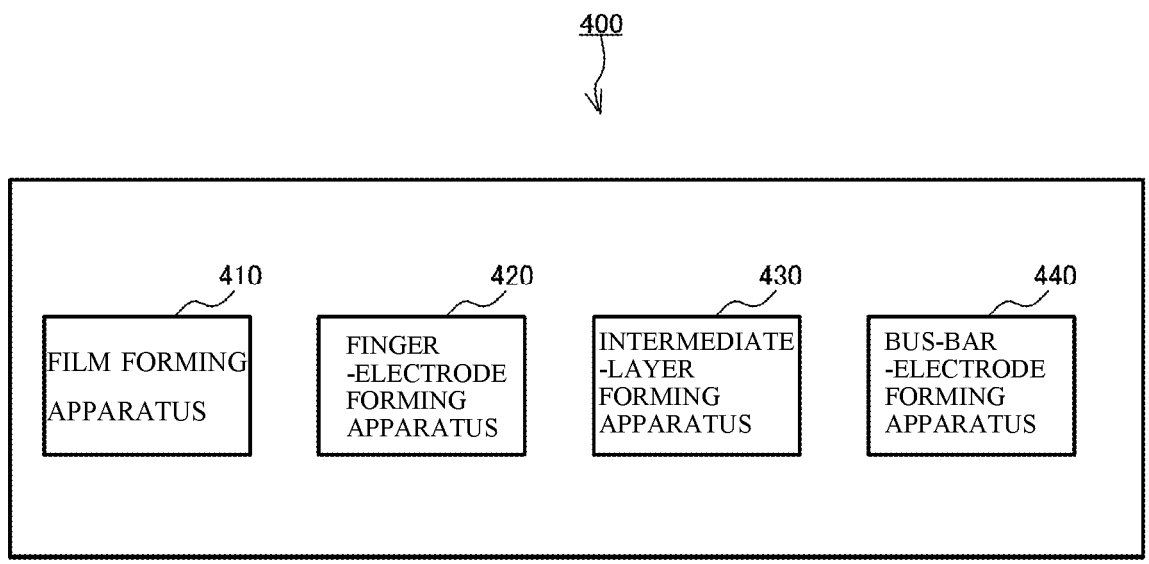
FIG. 3 is a block diagram showing the configuration of a solar cell manufacturing system suitable for manufacturing of the PR structure-type solar cell.

As shown in FIG. 3, the manufacturing system 400 for the PR structure-type solar cell at least includes a film forming apparatus 410 that forms a passivation film that protects a semiconductor substrate, a finger-electrode forming apparatus 420 that forms a first finger electrode connected to the semiconductor substrate on a main surface of the semiconductor substrate, an intermediate-layer forming apparatus 430 that forms an intermediate layer on the first finger electrode, and a bus-bar-electrode forming apparatus 440 that forms a first bus bar electrode that intersects the first finger electrode via the intermediate layer.

The film forming apparatus 410 can be, for example, a plasma CVD apparatus. When silicon oxide is used as the passivation film, the film forming apparatus 410 can be a heat treatment furnace capable of performing treatment in a clean atmosphere at temperature up to approximately 1000° C.

The finger-electrode forming apparatus 420 can be, for example, an apparatus configured from a screen printing apparatus, a drying furnace, and a baking furnace. The finger-electrode forming apparatus 420 bakes conductive aluminum paste to form the first finger electrode.

The intermediate-layer forming apparatus 430 can be, for example, an apparatus configured from a screen printing apparatus, a drying furnace, and a baking furnace. The intermediate-layer forming apparatus 430 bakes first conductive silver paste containing glass frit to form the intermediate layer. The baking furnace of the finger-electrode forming apparatus 420 and the baking furnace of the intermediate-layer forming apparatus 430 can be the same. Consequently, the conductive aluminum paste and the first conductive silver paste are simultaneously baked. Further, the finger-electrode forming apparatus 420 may also be used as one or more of the screen printing apparatus and the drying furnace of the intermediate-layer forming apparatus 430.

The bus-bar-electrode forming apparatus 440 can be, for example, an apparatus configured from a screen printing apparatus, a drying furnace, and a heating furnace. Depending on a temperature adjustable range of the drying furnace, the heating furnace is not always necessary. The bus-bar-electrode forming apparatus 440 heats second conductive silver paste containing epoxy resin or acrylic resin to form the first bus bar electrode. A difference between a baking time peak temperature of the conductive aluminum paste and the first conductive silver paste and a heating time peak temperature of the second conductive silver paste can be set to 300° C. or more and 700° C. or less. The bus-bar-electrode forming apparatus 440 may also be used as one or both of the screen printing apparatus and the drying furnace of the intermediate-layer forming apparatus 430.

The screen printing apparatus at least includes a printing unit, an alignment unit, and a conveying unit. The printing unit includes a squeegee, a scraper, and a printing plate. The printing plate can be changed as appropriate according to a desired printing pattern. Paste on the printing plate is coated (filled in a plate) by the scraper and printed (squeezed out from the plate to the substrate) by the squeegee. The alignment unit includes an imaging device (a camera, etc.) for recognizing a substrate position and a movable substrate stage and adjusts a printing position on the substrate to be always the same. The conveying unit passes the substrate to the printing stage and discharges the substrate.

The drying furnace and the heating furnace may continuously treat the substrate with a conveying mechanism of a belt conveyor type, a walking beam type, or the like or may be a batch type for collectively performing heat treatment of a plurality of substrates in a furnace. The drying furnace and the heating furnace may be coupled to the screen printing apparatus and the baking furnace by, for example, interposing a conveying apparatus therebetween. As a treatment temperature, a range of a room temperature to approximately 400° C. can be desirably controlled.

In general, the baking furnace continuously treats the substrate with the conveying mechanism of the belt conveyor type, the walking beam type, or the like. As a treatment temperature, a range of approximately 300° C. to 900° C. can be desirably controlled.

With the manufacturing system 400 explained above, the finger electrode formed by baking the conductive aluminum paste and the bus bar electrode formed by heating the low-temperature thermosetting silver paste are electrically connected at low resistance. An inexpensive and highly efficient PR structure-type solar cell that achieves both of the aluminum electrode (the finger electrode) and the low-temperature thermosetting bus bar electrode can be manufactured.

(Back Contact Type Solar Cell)

The above explanation is an example of the embodiment concerning the PR structure-type solar cell. The present invention can also be applied to a back contact type solar cell in which both of an emitter layer and a BSF layer are formed on a non-light receiving surface.

Figure 4:
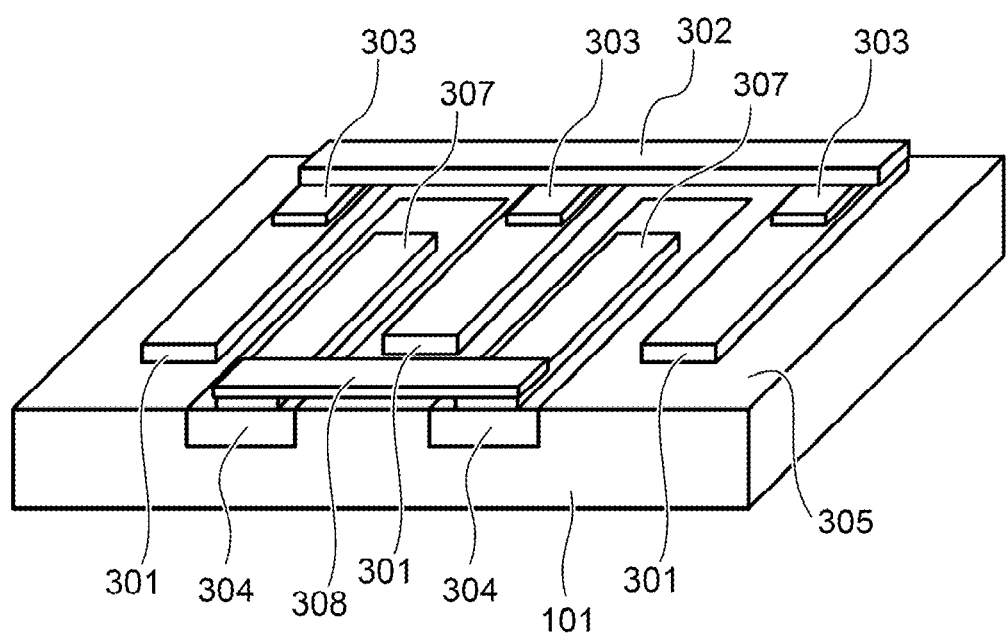
FIG. 4 is a perspective view of a rear surface of a back contact type solar cell.

FIG. 4 is a perspective view of the rear surface of the back contact type solar cell applied with the solar cell according to the present invention. On the rear surface of the semiconductor substrate 101, a first finger electrode 301 connected to an emitter layer 305, a first bus bar electrode 302 that intersects the first finger electrode 301, and an intermediate layer 303 provided between the first finger electrode 301 and the first bus bar electrode 302 are provided. In FIG. 4, for convenience of explanation, the intermediate layer 303 is drawn large.

On the rear surface of the semiconductor substrate 101, a second finger electrode 307 disposed alternately with the first finger electrode 301 and a second bus bar electrode 308 that intersects the second finger electrode 307 are provided. The second finger electrode 307 is connected to a BSF layer 304 provided on the rear surface of the semiconductor substrate 101.

In such a back contact type solar cell, the first finger electrode 301 and the first bus bar electrode 302 are electrically connected to each other via the intermediate layer 303. That is, carriers generated from the solar cell are efficiently extracted to the first bus bar electrode 302 via the intermediate layer 303 passing through the first finger electrode 301.

(Manufacturing System for the Back Contact Type Solar Cell)

Subsequently, a solar cell manufacturing system 500 suitable for manufacturing of the back contact type solar cell explained above is explained.

Figure 5:
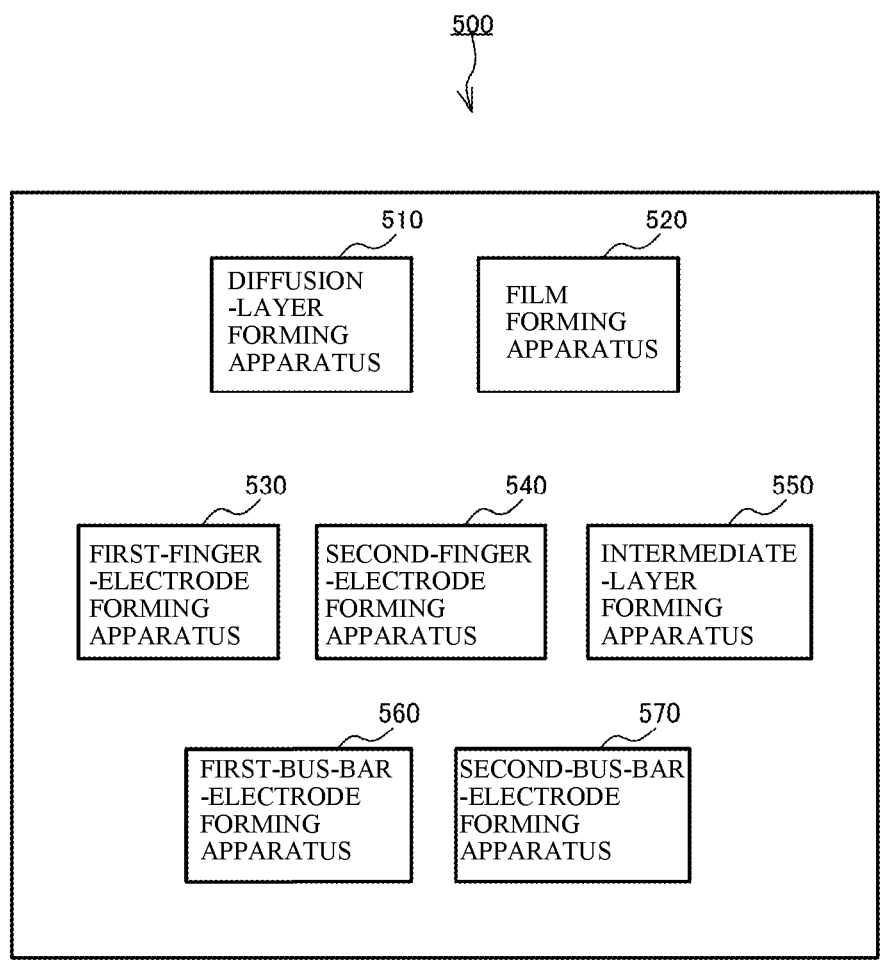
FIG. 5 is a block diagram showing the configuration of a solar cell manufacturing system suitable for manufacturing of the back contact type solar cell.

As shown in FIG. 5, the manufacturing system 500 for the back contact type solar cell according to the present invention at least includes a diffusion-layer forming apparatus 510 that forms a first diffusion layer of a first conductivity type provided on a main surface of a semiconductor substrate and a second diffusion layer of a second conductivity type provided on the main surface, a film forming apparatus 520 that forms a passivation film that protects the semiconductor substrate, the first diffusion layer, and the second diffusion layer, a first-finger-electrode forming apparatus 530 that forms a first finger electrode connected to the first diffusion layer on the main surface, a second-finger-electrode forming apparatus 540 that forms a second finger electrode connected to the second diffusion layer on the main surface, an intermediate-layer forming apparatus 550 that forms an intermediate layer on the first finger electrode, a first-bus-bar-electrode forming apparatus 560 that forms a first bus bar electrode that intersects the first finger electrode via the intermediate layer, and a second-bus-bar-electrode forming apparatus 570 that forms a second bus bar electrode that intersects the second finger electrode.

The diffusion-layer forming apparatus 510 can be, for example, a heat treatment furnace capable of performing treatment in a clean atmosphere at temperature up to approximately 1000° C. and capable of introducing a dopant gas such as $BBr_3$ or $POCl_3$.

The film forming apparatus 520 can be, for example, a plasma CVD apparatus. When silicon oxide is used as the passivation film, the film forming apparatus 520 can also be a heat treatment furnace capable of performing treatment in a clean atmosphere at temperature up to approximately 1000° C.

The first-finger-electrode forming apparatus 530 can be, for example, an apparatus configured from a screen printing apparatus, a drying furnace, and a baking furnace. The first-finger-electrode forming apparatus 530 bakes conductive aluminum paste to form the first finger electrode.

The second-finger-electrode forming apparatus 540 can be, for example, an apparatus configured from a screen printing apparatus, a drying furnace, and a baking furnace. The second-finger-electrode forming apparatus 540 bakes first conductive silver paste containing glass frit to form the second finger electrode.

The intermediate-layer forming apparatus 550 can be, for example, an apparatus configured from a screen printing apparatus, a drying furnace, and a baking furnace. The intermediate-layer forming apparatus 550 bakes second conductive silver paste containing glass frit to form the intermediate layer. The baking furnace of the first-finger-electrode forming apparatus 530 and the baking furnace of the second-finger-electrode forming apparatus 540 can be the same as the baking furnace of the intermediate-layer forming apparatus 550. Consequently, the first conductive silver paste, the second conductive silver paste, and the conductive aluminum paste are simultaneously baked. Further, the first-finger-electrode forming apparatus 530 and the second-finger-electrode forming apparatus 540 may also be used as one or more of the screen printing apparatus and the drying furnace of the intermediate-layer forming apparatus 550.

The first-bus-bar-electrode forming apparatus 560 and the second-bus-bar-electrode forming apparatus 570 can be, for example, an apparatus configured from a screen printing apparatus, a drying furnace, and a heating furnace. Depending on a temperature adjustable range of the drying furnace, the heating furnace is not always necessary. The first-bus-bar-electrode forming apparatus 560 heats third conductive silver paste containing epoxy resin or acrylic resin to form the first bus bar electrode. A difference between a baking time peak temperature of the first conductive silver paste, the second conductive silver paste, and the conductive aluminum paste and a heating time peak temperature of the third conductive silver paste can be set to 300° C. or more and 700° C. or less. The first-bus-bar-electrode forming apparatus 560 and the second-bus-bar-electrode forming apparatus 570 may also be used as one or both of the screen printing apparatus and the drying furnace of the intermediate-layer forming apparatus 550.

The screen printing apparatus at least includes a printing unit, an alignment unit, and a conveying unit. The printing unit includes a squeegee, a scraper, and a printing plate. The printing plate can be changed as appropriate according to a desired printing pattern. Paste on the printing plate is coated (filled in a plate) by the scraper and printed (squeezed out from the plate to the substrate) by the squeegee. The alignment unit includes an imaging device (a camera, etc.) for recognizing a substrate position and a movable substrate stage and adjusts a printing position on the substrate to be always the same. The conveying unit passes the substrate to the printing stage and discharges the substrate.

The drying furnace and the heating furnace may continuously treat the substrate with a conveying mechanism of a belt conveyor type, a walking beam type, or the like or may be a batch type for collectively performing heat treatment of a plurality of substrates in a furnace. The drying furnace and the heating furnace may be coupled to the screen printing apparatus and the baking furnace by, for example, interposing a conveying apparatus therebetween. As a treatment temperature, a range of a room temperature to approximately 400° C. can be desirably controlled.

In general, the baking furnace continuously treats the substrate with the conveying mechanism of the belt conveyor type, the walking beam type, or the like. As a treatment temperature, a range of approximately 300° C. to 900° C. can be desirably controlled.

With the manufacturing system 500 explained above, the finger electrode formed by baking the conductive aluminum paste and the bus bar electrode formed by heating the low-temperature thermosetting silver paste are electrically connected at low resistance. An inexpensive and highly efficient back electrode-type solar cell that achieves both of the aluminum electrode (the finger electrode) and the low-temperature thermosetting bus bar electrode can be manufactured.

(Examples and Comparative Examples)

The present invention is further explained below with reference to examples and comparative examples of the present invention. However, the present invention is not limited to the examples and the comparative examples and can be utilized in a wide range of uses.

First, outer diameter machining was performed on a p-type silicon substrate made of p-type single crystal silicon doped with boron, manufactured by being sliced to thickness of 0.2 mm, and having specific resistance of approximately 1 Ω·cm to form the p-type silicon substrate in a square plate shape having 15 cm on a side. Then, this substrate was immersed in a fluonitric acid solution for 15 seconds and damage-etched. Further, the substrate was chemically etched in a solution of 70° C. including 2% KOH and 2% IPA for 5 minutes and thereafter cleaned by pure water and dried to form texture structures on both surfaces of the substrate.

Thermal diffusion treatment was performed on the rear surface of the texture-formed substrate under conditions of a temperature of 950° C. and 30 minutes in a $BBr_3$ gas atmosphere, whereby a p-type diffusion layer functioning as a BSF layer and a glass layer were formed on the rear surface of the substrate. Sheet resistance after heat treatment of the prepared substrate surface was approximately 50 Ω/square on one surface, a maximum value of boron concentration was $1\times10^{20}$ atoms/cm$^3$, and a p-layer diffusion depth was 0.8 µm. Thereafter, the treated substrate was immersed in a 25% hydrofluoric acid solution and thereafter cleaned by pure water and dried to remove the glass layer.

Further, the thermal diffusion treatment was performed on a light receiving surface of the p-type diffusion layer-formed substrate under conditions of temperature of 900° C. and 20 minutes in a $POCl_3$ gas atmosphere, whereby an n-type diffusion layer and a glass layer was formed on the light receiving surface of the substrate. Sheet resistance after heat treatment of the prepared substrate receiving surface was approximately 60 Ω/square on one surface, a maximum value of phosphorus concentration was $7\times10^{19}$ atoms/cm$^3$, and an n-type diffusion layer depth was 0.4 µm. Thereafter, the substrate was immersed in a 25% hydrofluoric acid solution and thereafter cleaned by pure water and dried to remove the glass layer.

Subsequently, SiN to be an antireflection film and a passivation film was formed at thickness of 1000 Å on the light receiving surface and the rear surface of the substrate by a plasma CVD method using $SiH_4$, $NH_3$, and $N_2$.

Subsequently, conductive silver paste was printed on the light receiving surface of the substrate, to which the treatment so far was applied, in patterns of a finger electrode shape and a bus bar electrode shape using a screen printing method and was dried at 150° C. In the following explanation, the finger electrode shape means seventy-three skewer-shaped electrodes formed at width of 0.1 mm and a pitch of 2 mm. The bus bar electrode shape means two electrodes orthogonal to and crossing the finger electrodes at width of 2 mm and a pitch of 74 mm. As the conductive silver paste, SOL9383M manufactured by Heraeus Group containing glass frit and silver was used. Thereafter, the pretreated substrate was baked at a maximum temperature of 800° C. for 5 seconds to form light receiving surface finger electrodes and light receiving surface bus bar electrodes made of a sintered body of glass frit and silver.

Thereafter, the conductive silver paste was printed on the rear surface of the light receiving surface electrode-formed substrate in patterns of a finger electrode shape and a bus bar electrode shape using the screen printing method and was dried at 150° C. As the conductive silver paste, SOL9383M manufactured by Heraeus Group was used. Thereafter, the pretreated substrate was baked at a maximum temperature of 800° C. for 5 seconds to form rear surface finger electrodes and rear surface bus bar electrodes made of a sintered body of glass frit and silver to manufacture a PR structure-type solar cell (a comparative example 1).

On the other hand, conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. containing aluminum was used. Thereafter, the pretreated substrate was baked at a maximum temperature of 800° C. for 5 seconds to form rear surface finger electrodes made of a sintered body of aluminum.

Thereafter, low-temperature thermosetting silver paste containing epoxy resin and silver was printed in a bus bar electrode shape using the screen printing method and was dried at 100° C. As the low-temperature thermosetting silver paste, HL80-7147 manufactured by Heraeus Group was used. Although the low-temperature thermosetting silver paste containing epoxy resin and silver was used, for example, low-temperature thermosetting conductive silver paste RA FS 074 manufactured by Toyochem Co., Ltd. containing acrylic resin and silver may be used. Thereafter, the pretreated substrate was heated at a maximum temperature of 300° C. for 5 minutes to form rear surface bus bar electrodes made of a sintered body of epoxy resin and silver to manufacture a PR structure-type solar cell (a comparative example 2).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed as intermediate layers in a square shape of 0.03 m×0.03 mm using the screen printing method and was dried at 150° C. In this case, (an area of the intermediate layers)/(a stacking area of the finger electrodes and the bus bar electrodes) is (0.03 m×0.03 mm)/(0.1 m×2 mm)=0.0045. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 300° C. for 5 minutes to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.–300° C.=500° C. (an example 1).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed as intermediate layers in a square shape of 0.045 m×0.045 mm using the screen printing method and was dried at 150° C. In this case, (an area of the intermediate layers)/(a stacking area of the finger electrodes and the bus bar electrodes) is (0.045 m×0.045 mm)/(0.1 m×2 mm)≈0.01. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 300° C. for 5 minutes to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.–300° C.=500° C. (an example 2).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed as intermediate layers in a square shape of 0.1 m×0.1 mm using the screen printing method and was dried at 150° C. In this case, (an area of the intermediate layers)/(a stacking area of the finger electrodes and the bus bar electrodes) is (0.1 m×0.1 mm)/(0.1 m×2 mm)=0.05. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 300° C. for 5 minutes to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.–300° C.=500° C. (an example 3).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed as intermediate layers in a square shape of 0.1 m×2 mm using the screen printing method and was dried at 150° C. In this case, (an area of the intermediate layers)/(a stacking area of the finger electrodes and the bus bar electrodes) is (0.1 m×2 mm)/(0.1 m×2 mm)=1. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 300° C. for 5 minutes to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.–300° C.=500° C. (an example 4).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed in a square shape of 0.13 m×2 mm using the screen printing method such that intermediate layers protrude from the finger electrodes and was dried at 150° C. In this case, (an area of the intermediate layers)/(a stacking area of the finger electrodes and the bus bar electrodes) is (0.13 m×2 mm)/(0.1 m×2 mm)=1.3. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 300° C. for 5 minutes to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.−300° C.=500° C. (an example 5).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed as intermediate layers in a square shape of 0.1 m×0.1 mm using the screen printing method and was dried at 150° C. In this case, (an area of the intermediate layers)/(a stacking area of the finger electrodes and the bus bar electrodes) is (0.1 m×0.1 mm)/(0.1 m×2 mm)=0.05. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 600° C. for 5 minutes to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.−600° C.=200° C. (an example 6).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed as intermediate layers in a square shape of 0.1 m×0.1 mm using the screen printing method and was dried at 150° C. In this case, (an area of the intermediate layers)/(a stacking area of the finger electrodes and the bus bar electrodes) is (0.1 m×0.1 mm)/(0.1 m×2 mm)=0.05. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 500° C. for 5 minutes to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.−500° C.=300° C. (an example 7).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed as intermediate layers in a square shape of 0.1 m×0.1 mm using the screen printing method and was dried at 150° C. In this case, (an area of the intermediate layers)/(a stacking area of the finger electrodes and the bus bar electrodes) is (0.1 m×0.1 mm)/(0.1 m×2 mm)=0.05. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 100° C. to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.−100° C.=700° C. (an example 8).

The conductive aluminum paste was printed on the rear surface of the light receiving surface electrode-formed substrate in a finger electrode shape using the screen printing method and was dried at 150° C. As the conductive aluminum paste, L210 manufactured by GigaSolar Co., Ltd. was used. Further, in parts where bus bar electrodes were planned to intersect on finger electrodes, the conductive silver paste was printed as intermediate layers in a square shape of 0.1 m×0.1 mm using the screen printing method and was dried at 150° C.

In this case, (an area of the intermediate layers)/(a stacking area of the finger electrodes and the bus bar electrodes) is (0.1 m×0.1 mm)/(0.1 m×2 mm)=0.05. As the conductive silver paste, SOL9383M manufactured by Heraeus Group was used.

Thereafter, the pretreated substrate was baked at a maximum temperature of 800° C. for 5 seconds to form rear surface finger electrodes made of a sintered body of aluminum and intermediate layers made of a sintered body of glass frit and silver. Thereafter, the low-temperature thermosetting silver paste containing epoxy resin and silver was printed in a bus bar electrode shape using the screen printing method to overlap the intermediate layers and was dried at 100° C. As the low-temperature thermosetting silver paste, HL80-7147 manufactured by Heraeus Group was used.

Thereafter, the pretreated substrate was heated at a maximum temperature of 80° C. to form rear surface bus bar electrodes made of a sintered body of epoxy resin and silver to manufacture a PR structure-type solar cell. A difference between a baking time peak temperature of the conductive aluminum paste and the conductive silver paste and a heating time peak temperature of the low-temperature thermosetting silver paste is 800° C.−80° C.=720° C. (an example 9).

The finger electrodes and the rear surface finger electrodes in the example 1 to the example 9 are equivalent to the rear surface finger electrode 201 shown in FIG. 2. The bus bar electrodes and the rear surface bus bar electrodes are equivalent to the rear surface bus bar electrode 202 shown in FIG. 2. The intermediate layers are equivalent to the intermediate layer 203 shown in FIG. 2.

In Table 1, average conversion efficiency and presence or absence of the effects of the present invention at the time when twenty PR structure-type solar cells were manufactured by each of the methods in the comparative example 1 and the comparative example 2, and the example 1 to the example 9 are shown.

It has also been found that, in order to efficiently increase the conversion efficiency using the present invention, when an area of the intermediate layers viewed in a direction orthogonal to the main surface (e.g., the rear surface) is represented as A and an intersecting area of the finger electrodes and the bus bar electrodes is represented as B, A/B is desirably 0.01 or more and 1 or less. This is because, if this value is too small, the intermediate layers are too small and the resistance between the finger electrodes and the bus bar electrodes is not sufficiently low and, if this value is too large, the intermediate layers are too large and protrude to the passivation layer to increase the surface recombination rate.

It has also been found that the difference between the baking time peak temperature of the conductive aluminum paste and the conductive silver paste and the heating time peak temperature of the low-temperature thermosetting silver paste is desirably 300° C. or more and 700° C. or less. This is because, if this difference is too small, the low-temperature thermosetting silver paste increases the surface recombination rate and, if this difference is too large, the low-temperature thermosetting silver paste does not sufficiently harden and easily peels.

The above explanation is a result obtained when the present invention is applied to the PR structure-type solar cell. As explained above, the present invention is applicable to the back contact type solar cell as well. The back contact type solar cell is more specifically explained below with

TABLE 1

| | (An area of the intermediate layers)/ (A stacking area of the finger electrodes and the bus bar electrodes) | A difference between a baking time peak temperature of the conductive aluminum paste and the conductive silver paste and a heating time peak temperature of the low-temperature thermosetting silver paste | Average conversion efficiency (%) | Effects |
|---|---|---|---|---|
| Comparative example 1 | — | — | 18.9 | — |
| Comparative example 2 | — | — | 16.3 | — |
| Example 1 | 0.0045 | 500° C. | 17.2 | Absent |
| Example 2 | 0.01 | 500° C. | 19.5 | Present |
| Example 3 | 0.05 | 500° C. | 19.6 | Present |
| Example 4 | 1 | 500° C. | 19.4 | Present |
| Example 5 | 1.3 | 500° C. | 18.8 | Absent |
| Example 6 | 0.05 | 200° C. | 13.1 | Absent |
| Example 7 | 0.05 | 300° C. | 19.5 | Present |
| Example 8 | 0.05 | 700° C. | 19.1 | Present |
| Example 9 | 0.05 | 720° C. | 18.4 | Absent |

In the comparative example 2, only the finger electrodes formed by baking the conductive aluminum paste and the bus bar electrodes formed by heating the low-temperature thermosetting silver paste were used and the intermediate layers were not formed. Therefore, the resistance between the finger electrodes and the bus bar electrodes increased. The conversion efficiency was lower than the conversion efficiency in the comparative example 1.

By using the examples according to the present invention, compared with the comparative examples, the average conversion efficiency of the PR structure-type solar cell was able to be increased. This is because both of the finger electrodes formed by baking the inexpensive conductive aluminum paste, which was able to achieve both of an aluminum contact resistance decrease and a recombination rate decrease on the substrate surface, and the bus bar electrodes formed by heating the low-temperature thermosetting silver paste, which prevented a recombination rate decrease of a diffusion layer, were able to be achieved.

reference to examples and comparative examples of the present invention. However, the present invention is not limited to the examples and the comparative examples and can be utilized in a wide range of uses.

First, outer diameter machining was performed on an n-type silicon substrate made of n-type single crystal silicon doped with phosphorus, manufactured by being sliced to thickness of 0.2 mm, and having specific resistance of approximately 1 Ω·cm to form the n-type silicon substrate in a square plate shape having 15 cm on a side. Then, this substrate was immersed in a fluonitric acid solution for 15 seconds and damage-etched and thereafter cleaned by pure water and dried.

The substrate after the damage etch was thermally oxidized under conditions of temperature of 1000° C. and 120 minutes in an oxygen atmosphere, whereby silicon oxide films were formed on both surfaces of the substrate at thickness of 700 Å. Resist paste was screen-printed on a BSF layer formation planned part of the silicon oxide film formed on the rear surface of the substrate and was heated at temperature of 100° C. and dried. A plate for screen printing was formed in a pattern to be structure of an Interdigitated Back Contact cell in which an emitter layer had width of 800 μm, a BSF layer had width of 200 μm, and the emitter layer and the BSF layer were alternately formed. As the resist paste, 185 paste manufactured by LEKTRACHEM Limited was used.

The substrate was immersed in a 2% hydrofluoric acid solution to partially remove the silicon oxide film while leaving the silicon oxide film on the BSF layer formation planned part. Then, the substrate was immersed in acetone to remove the resist paste and thereafter cleaned by pure water and dried.

Subsequently, the thermal diffusion treatment was performed on the rear surface of the substrate under conditions of a temperature of 900° C. and 20 minutes in a $BBr_3$ gas atmosphere, whereby a p-type diffusion layer functioning as an emitter layer and a glass layer were formed on the rear surface of the substrate. Sheet resistance after heat treatment of the prepared n-type silicon substrate rear surface was approximately 70 Ω/square and a p-type diffusion layer depth was 0.5 μm. Thereafter, this substrate was immersed in a 25% hydrofluoric acid solution and thereafter cleaned by pure water and dried to remove the silicon oxide film and the glass layer.

The substrate after the emitter layer formation was thermally oxidized under conditions of temperature of 1000° C. and 120 minutes in the oxygen atmosphere, whereby silicon oxide films were formed on both the surfaces of the substrate at thickness of 700 Å. Resist paste was screen-printed on a part where the emitter layer was formed in the silicon oxide film formed on the rear surface of the substrate and was heated at temperature of 100° C. and was dried. As the resist paste, 185 paste manufactured by LEKTRACHEM Limited was used. The substrate was immersed in a 2% hydrofluoric acid solution to partially remove the silicon oxide film while leaving the silicon oxide film on the part where the emitter layer was formed. Then, the substrate was immersed in acetone to remove the resist paste.

Further, the thermal diffusion treatment was performed on the rear surface of the substrate under conditions of a temperature of 930° C. and 20 minutes in a $POCl_3$ gas atmosphere, whereby phosphorus was diffused in the part where the silicon oxide film was removed and an n-type diffusion layer functioning as a BSF layer and a glass layer were formed. Sheet resistance after heat treatment of the BSF layer was approximately 30 Ω/square and an n-type diffusion layer depth was 0.5 μm. Thereafter, these substrates were immersed in a 25% hydrofluoric acid solution and thereafter cleaned by pure water and dried to remove the silicon oxide film and the glass layer.

Subsequently, resist paste was screen-printed over the entire rear surface of the substrate and heated at temperature of 100° C. and was dried. As the resist paste, 185 paste manufactured by LEKTRACHEM Limited was used. The substrate was chemically etched in a solution of 70° C. including 2% potassium hydroxide and 2% IPA for 5 minutes and thereafter cleaned by pure water and dried to form a texture structure on the light receiving surface of the substrate. Then, the substrate was immersed in acetone to remove the resist paste.

Subsequently, a silicon nitride film to be an antireflection film and a passivation film was formed at thickness of 1000 Å on the light receiving surface and the rear surface of the substrate by a plasma CVD method using $SiH_4$, $NH_3$, and $N_2$.

Further, conductive silver paste was printed on the emitter surface of the substrate, to which the treatment up to the passivation film formation treatment was applied, in patterns of a finger electrode shape and a bus bar electrode shape using the screen printing method and was dried at 150° C. In the following explanation, the finger electrode shape means seventy-three skewer-shaped electrodes formed at width of 0.1 mm and a pitch of 2 mm. The bus bar electrode shape means one electrode orthogonal to and crossing the finger electrodes at width of 2 mm. As the conductive silver paste, SOL9383M manufactured by Heraeus Group containing glass frit and silver was used.

Further, the conductive silver paste was printed on the BSF layer of the substrate, to which the treatment so far was applied, in patterns of a finger electrode shape and a bus bar electrode shape using the screen printing method and was dried at 150° C. As the conductive silver paste, SOL9383M manufactured by Heraeus Group containing glass frit and silver was used.

Thereafter, the treated substrate was baked at a maximum temperature of 800° C. for 5 seconds to form finger electrodes and bus bar electrodes formed by a sintered body of glass frit and silver and connected to the emitter layer and finger electrodes and bus bar electrodes connected to the BSF layer to manufacture a back contact type solar cell (a comparative example 3).

On the other hand, the conductive aluminum paste was printed on the emitter layer of the substrate, to which the treatment up to the passivation film formation treatment was applied, in a pattern of a finger electrode shape using the screen printing method and was dried at 150° C. As the conductive aluminum paste, L210 manufactured by GigaSolar Co., Ltd. containing aluminum was used. Further, the conductive silver paste was printed on the BSF layer of the substrate, to which the treatment so far was applied, in patterns of a finger electrode shape and a bus bar electrode shape using the screen printing method and was dried at 150° C. As the conductive silver paste, SOL9383M manufactured by Heraeus Group containing glass frit and silver was used.

Thereafter, the treated substrate was baked at a maximum temperature of 800° C. for 5 seconds to form finger electrodes formed by a sintered body of aluminum and connected to the emitter layer and finger electrodes formed by a sintered body of glass frit and silver and connected to the BSF layer. Thereafter, the low-temperature thermosetting silver paste containing epoxy resin and silver was printed using the screen printing method in a bus bar electrode shape of the finger electrodes connected to the emitter layer and a bus bar electrode shape of the finger electrodes connected to the BSF layer and was dried at 100° C.

As the low-temperature thermosetting silver paste, HL80-7147 manufactured by Heraeus Group was used. Although the low-temperature thermosetting silver paste containing epoxy resin and silver was used, for example, low-temperature thermosetting conductive silver paste RA FS 074 manufactured by Toyochem Co., Ltd. containing acrylic resin and silver may be used. Thereafter, the pretreated substrate was heated at a maximum temperature of 300° C. for 5 minutes to form bus bar electrodes made of a sintered body of epoxy resin and silver to manufacture a back contact type solar cell (a comparative example 4).

On the other hand, the conductive aluminum paste was printed on the emitter surface of the substrate, to which the treatment up to the passivation film formation treatment was applied, in a pattern of a finger electrode shape using the screen printing method and was dried at 150° C. As the conductive aluminum paste, L210 manufactured by GigaSolar Co., Ltd. containing aluminum was used. Further, the conductive silver paste was printed on the BSF layer of the substrate, to which the treatment so far was applied, in patterns of a finger electrode shape and a bus bar electrode shape using the screen printing method and was dried at 150° C. As the conductive silver paste, SOL9383M manufactured by Heraeus Group containing glass frit and silver was used.

Thereafter, in parts where bus bar electrodes were planned to intersect on finger electrodes connected to the emitter layer, the conductive silver paste was printed as intermediate layers in a square shape of 0.1 m×0.1 mm using the screen printing method and was dried at 150° C. In this case, (an area of the intermediate layers)/(a stacking area of the finger electrodes and the bus bar electrodes) is (0.1 m×0.1 mm)/(0.1 m×2 mm)=0.05. As the conductive silver paste, SOL9383M manufactured by Heraeus Group was used.

Thereafter, the pretreated substrate was baked at a maximum temperature of 800° C. for 5 seconds to form finger electrodes made of a sintered body of aluminum and connected to the emitter layer and finger electrodes made of a sintered body of glass frit and silver and connected to the BSF layer.

Thereafter, the low-temperature thermosetting silver paste containing epoxy resin and silver was printed in a bus bar electrode shape of the finger electrodes connected to the emitter layer and a bus bar electrode shape of the finger electrodes connected to the BSF layer using the screen printing method and was dried at 100° C. As the low-temperature thermosetting silver paste, HL80-7147 manufactured by Heraeus Group was used.

Thereafter, the pretreated substrate was heated at a maximum temperature of 300° C. for 5 minutes to form bus bar electrodes made of a sintered body of epoxy resin and silver to manufacture a back contact type solar cell (an example 10).

On the other hand, the conductive aluminum paste was printed on the emitter layer of the substrate, to which the treatment up to the passivation film formation treatment was applied, in a pattern of a finger electrode shape using the screen printing method and was dried at 150° C. As the conductive aluminum paste, L210 manufactured by GigaSolar Co., Ltd. containing aluminum was used. Further, on the BSF layer of the substrate, to which the treatment so far was applied, and parts where bus bar electrodes were planned to intersect on finger electrodes connected to the emitter layer, the conductive silver paste was simultaneously printed in patterns of a finger electrode shape and a bus bar electrode shape and a pattern of intermediate layers using the screen printing method and was dried at 150° C.

As the conductive silver paste, SOL9383M manufactured by Heraeus Group containing glass frit and silver was used. The pattern of the intermediate layers is a square shape of 0.1 m×0.1 mm. In this case, (an area of the intermediate layers)/(a stacking area of the finger electrodes and the bus bar electrodes) is (0.1 mm×0.1 mm)/(0.1 m×2 mm)=0.05. As the conductive silver paste, SOL9383M manufactured by Heraeus Group was used.

Thereafter, the pretreated substrate was baked at a maximum temperature of 800° C. for 5 seconds to form finger electrodes made of a sintered body of aluminum and connected to the emitter layer and finger electrodes made of a sintered body of glass frit and silver and connected to the BSF layer.

Thereafter, the low-temperature thermosetting silver paste containing epoxy resin and silver was printed in a bus bar electrode shape of the finger electrodes connected to the emitter layer and a bus bar electrode shape of the finger electrodes connected to the BSF layer using the screen printing method and was dried at 100° C. As the low-temperature thermosetting silver paste, HL80-7147 manufactured by Heraeus Group was used.

Thereafter, the pretreated substrate was heated at a maximum temperature of 300° C. for 5 minutes to form bus bar electrodes made of a sintered body of epoxy resin and silver to manufacture a back contact type solar cell (an example 11).

The finger electrodes connected to the emitter layer in the example 10 and the example 11 are equivalent to the first finger electrode 301 shown in FIG. 4. The bus bar electrodes provided on the finger electrodes connected to the emitter layer are equivalent to the first bus bar electrode 302 shown in FIG. 4. The finger electrodes connected to the BSF layer are equivalent to the second finger electrode 307 shown in FIG. 4. The bus bar electrodes provided on the finger electrodes connected to the BSF layer are equivalent to the second bus bar electrode 308 shown in FIG. 4. The intermediate layers are equivalent to the intermediate layer 303 shown in FIG. 4.

In Table 2, average conversion efficiency and presence or absence of the effects of the present invention at the time when twenty back contact type solar cells were manufactured by each of the methods in the comparative example 3 and the comparative example 4 and the example 10 and the example 11 are shown.

TABLE 2

| | (An area of the intermediate layers)/ (A stacking area of the finger electrodes and the bus bar electrodes) | A difference between a baking time peak temperature of the conductive aluminum paste and the conductive silver paste and a heating time peak temperature of the low-temperature thermosetting silver paste | Average conversion efficiency (%) | Effects |
|---|---|---|---|---|
| Comparative example 3 | — | — | 19.3 | — |
| Comparative example 4 | — | — | 16.6 | — |
| Example 10 | 0.05 | 500° C. | 19.9 | present |
| Example 11 | 0.05 | 500° C. | 19.9 | present |

In the comparative example 4, only the finger electrodes formed by baking the conductive aluminum paste and the bus bar electrodes formed by heating the low-temperature thermosetting silver paste were used and the intermediate layers were not formed. Therefore, the resistance between the finger electrodes and the bus bar electrodes increased. The conversion efficiency was lower than the conversion efficiency in the comparative example 3.

By using the examples according to the present invention, compared with the comparative examples, the average conversion efficiency of the back contact type solar cell was able to be increased. This is because both of the finger electrodes formed by baking the inexpensive conductive aluminum paste, which can achieve both of a contact resistance decrease and a recombination rate decrease on the substrate surface, and the bus bar electrodes formed by heating the low-temperature thermosetting silver paste, which prevents a recombination rate decrease of a diffusion layer, were able to be achieved. It has also been found that the conversion efficiency does not change even if the finger electrodes connected to the BSF and the intermediate layers are simultaneously screen-printed.

Note that the present invention is not limited to the embodiments. The embodiments are illustrations. Any embodiment having substantially the same configuration as the technical idea described in the claims of the present invention and achieving similar operational effects is included in the technical scope of the present invention.

REFERENCE SIGNS LIST

101 . . . semiconductor substrate
102 . . . emitter layer
103 . . . passivation film
104 . . . BSF layer
105 . . . electrode
106 . . . passivation film
107 . . . electrode
201 . . . rear surface finger electrode
202 . . . rear surface bus bar electrode
203 . . . intermediate layer
301 . . . first finger electrode
302 . . . first bus bar electrode
303 . . . intermediate layer
304 . . . BSF layer
305 . . . emitter layer
307 . . . second finger electrode
308 . . . second bus bar electrode
400 . . . manufacturing system
410 . . . film forming apparatus
420 . . . finger-electrode forming apparatus
430 . . . intermediate-layer forming apparatus
440 . . . bus-bar-electrode forming apparatus
500 . . . manufacturing system
510 . . . diffusion-layer forming apparatus
520 . . . film forming apparatus
530 . . . first-finger-electrode forming apparatus
540 . . . second-finger-electrode forming apparatus
550 . . . intermediate-layer forming apparatus
560 . . . first-bus-bar-electrode forming apparatus
570 . . . second-bus-bar-electrode forming apparatus

What is claimed is:

1. A solar cell manufacturing method comprising:
   forming a passivation film that protects a semiconductor substrate;
   forming a first finger electrode connected to the semiconductor substrate on a main surface of the semiconductor substrate;
   forming an intermediate layer on the first finger electrode; and
   forming a first bus bar electrode that intersects the first finger electrode via the intermediate layer, wherein
   in the forming the first finger electrode, conductive aluminum paste is baked to form the first finger electrode,
   in the forming the intermediate layer, first conductive silver paste containing glass frit is baked to form the intermediate layer,
   the conductive aluminum paste and the first conductive silver paste are simultaneously baked,
   in the forming the first bus bar electrode, second conductive silver paste containing epoxy resin or acrylic resin is heated to form the first bus bar electrode, and
   a difference between a baking time peak temperature of the conductive aluminum paste and the first conductive silver paste and a heating time peak temperature of the second conductive silver paste is 300° C. or more and 700° C. or less.

2. A solar cell manufacturing method comprising:
   forming a first diffusion layer of a first conductivity type provided on a main surface of a semiconductor substrate and a second diffusion layer of a second conductivity type provided on the main surface;
   forming a passivation film that protects the semiconductor substrate, the first diffusion layer, and the second diffusion layer;
   forming a first finger electrode connected to the first diffusion layer on the main surface;
   forming a second finger electrode connected to the second diffusion layer on the main surface;
   forming an intermediate layer on the first finger electrode;
   forming a first bus bar electrode that intersects the first finger electrode via the intermediate layer; and
   forming a second bus bar electrode that intersects the second finger electrode, wherein
   in the forming the second finger electrode, first conductive silver paste containing glass frit is baked to form the second finger electrode,
   in the forming the intermediate layer, second conductive silver paste containing glass frit is baked to form the intermediate layer,
   in the forming the first finger electrode, conductive aluminum paste is baked to form the first finger electrode,
   the first conductive silver paste, the second conductive silver paste, and the conductive aluminum paste are simultaneously baked,
   in the forming the first bus bar electrode, third conductive silver paste containing epoxy resin or acrylic resin is heated to form the first bus bar electrode, and
   a difference between a baking time peak temperature of the first conductive silver paste, the second conductive silver paste, and the conductive aluminum paste and a heating time peak temperature of the third conductive silver paste is 300° C. or more and 700° C. or less.

3. The solar cell manufacturing method according to claim 2, wherein application of the first conductive silver paste forming the second finger electrode and application of the second conductive silver paste forming the intermediate layer are simultaneously performed.

* * * * *